United States Patent
Xu et al.

(10) Patent No.: US 12,507,368 B2
(45) Date of Patent: Dec. 23, 2025

(54) FLOATING EXTENDED PANEL SOLUTION FOR DCI CHASSIS

(71) Applicant: II-VI Photonics Inc., Fuzhou (CN)

(72) Inventors: Yonghao Xu, Shanghai (CN); Peigang Hu, Shanghai (CN); Jianfeng Ying, Shanghai (CN)

(73) Assignee: II-VI DELAWARE, INC., Wilmington, DE (US)

( * ) Notice: Subject to any disclaimer, the term of this patent is extended or adjusted under 35 U.S.C. 154(b) by 392 days.

(21) Appl. No.: 18/166,648

(22) Filed: Feb. 9, 2023

(65) Prior Publication Data

US 2023/0262920 A1  Aug. 17, 2023

(30) Foreign Application Priority Data

Feb. 15, 2022 (CN) .......................... 202220299982.9

(51) Int. Cl.
*H05K 7/14* (2006.01)
(52) U.S. Cl.
CPC ......... *H05K 7/1489* (2013.01); *H05K 7/1491* (2013.01)
(58) Field of Classification Search
None
See application file for complete search history.

(56) References Cited

U.S. PATENT DOCUMENTS

| | | | |
|---|---|---|---|
| 10,952,345 B2* | 3/2021 | Gupta | H05K 7/1491 |
| 2010/0328872 A1* | 12/2010 | Chou | H05K 7/1494 |
| | | | 248/220.21 |
| 2015/0366092 A1* | 12/2015 | Grandidge | G02B 6/4455 |
| | | | 248/68.1 |
| 2016/0224058 A1* | 8/2016 | Ecker | G06F 3/0227 |
| 2016/0286672 A1* | 9/2016 | Wolf | H05K 5/0226 |
| 2018/0352673 A1* | 12/2018 | Leigh | H01R 25/006 |
| 2020/0078116 A1* | 3/2020 | Oberkircher | A61B 18/14 |
| 2020/0100384 A1* | 3/2020 | Sassano | H05K 7/183 |

* cited by examiner

*Primary Examiner* — Allen L Parker
*Assistant Examiner* — Christopher L Augustin
(74) *Attorney, Agent, or Firm* — Blank Rome LLP

(57) ABSTRACT

Optical communication equipment used in data center interconnection (DCI) applications includes a chassis, having one or more panel modules or line cards and an earring bracket for securing the chassis. Also included is an extended management bracket, extending from the chassis, and an extended function module extending from the extended management bracket, located in an area in front of the chassis. A cable can be provided between the chassis and the extended function module, supporting data transmission therebetween. Alternatively, or in addition, a printed circuit board assembly can be mounted within the chassis, extending outside the chassis, along or within the extended management bracket, from a proximal end to a distal end of the extended management bracket, configured for connection to components of the extended function module, where the printed circuit board assembly supports data transmission and/or power supply between the chassis and components of the extended function module.

20 Claims, 3 Drawing Sheets

FLOATING EXTENDED PANEL SOLUTION FOR DCI CHASSIS

RELATED APPLICATION

This application claims benefit of priority of China Utility Model No. (UM) ZL 2022 2 0299982.9, filed Feb. 15, 2022, granted Jun. 14, 2022; which application is incorporated herein by reference.

FIELD

The present invention relates generally to the field of optical communication systems, and particularly to chassis equipment of data center interconnection (DCI) applications.

BACKGROUND

Traditional chassis equipment typically used in data center interconnection (DCI) applications include a pluggable or non-pluggable chassis with panel module, accepting line cards, with expander connections like Ethernet, serial port, other input/output (I/O) ports, etc., and a display screen for field maintenance. After being mounted into a data center cabinet, rack, or shelf, the chassis usually includes an external wire management device to secure fiber or wire routing to and from the chassis equipment.

However, with higher and higher space density requirements of chassis equipment, less and less space is being reserved for the expander connections. This is because higher overall performance is found when maximum chassis space is reserved for line cards. Also, for this reason, if a display screen is required, display size will be small, with minimal functions provided, so to preserve chassis space for line cards.

In addition, use of typical external wire management devices can be disadvantageous. For example, for spatial efficiency, wire management devices are often installed in an earring area of the chassis (i.e., at a left or right end of the chassis, out of the way of a front of the chassis components).

Such a traditional layout can be unfavorable. First, the wire management device can be installed only after all chassis equipment is mounted in the chassis, and the one or more chassis are mounted in the cabinet. This increases installation time. Second, due to space density requirements, front panel space of the chassis is mostly reserved for service line cards and/or panel modules, which results in limited space for various expander connections, such as I/O port(s) or high definition (HD), thin film transistor (TFT) or liquid-crystal display (LCD) screens, and which limits convenient maintenance. Third, after the chassis equipment is deployed in field, and new features or components are required, replacement of an entire chassis, and/or a pluggable panel module therein, is cumbersome. Therefore, traditional chassis layouts limit feature flexibility by application and restricts future expandability.

SUMMARY

Due to the disadvantages articulated above, and the current shortage of chassis equipment, and/or limitation of chassis equipment space, the disclosed embodiments provide an extended function module that enables chassis feature extension without limitation to the space available on a front panel area of the chassis, and without restriction to chassis configuration flexibility in a data center interconnection (DCI) application.

The disclosed subject matter relates to optical communication equipment used in DCI applications that typically include at least one or more chassis, each with one or more fixed or pluggable panel modules and, usually, multiple service line cards. DCI applications connect two or more data centers using high speed packet-optical connectivity. DCI applications house computer and storage resources for applications, data and content. A panel module of the chassis is a functional module, is fixed or pluggable, and provides maintenance and port capability. A line card is a printed circuit board responsible for data transfer, providing a transmitting/receiving port for a local area network (LAN), or a carrier's communication, or a wide area network (WAN). Line cards plug into company switches and high-end routers, which have a modular chassis that accepts a range of cards.

The optical communication equipment (e.g., multiple chassis, each with multiple line cards) is mounted into a data center cabinet, rack, or shelf. Attachment to the cabinet is often mechanical by earring bracket. An organizing bracket with guideway is often included on a left or right side of the chassis, in a vicinity of the earring bracket, for fiber and wiring management.

As detailed above, the disclosed subject matter also includes an extended function module that communicates with the chassis. The extended function module can include one or more of a micro-processer, a storage unit, a display screen, an input/output (I/O) expand, and power charging unit. If a micro-processer is included, the micro-processor is wired to other components and is powered by either an internal or external power supply.

In one aspect, the disclosed embodiments provide optical communication equipment used in data center interconnection applications. The equipment includes a chassis, including one or more panel modules or line cards, and an earring bracket for securing the chassis. Also included is an extended management bracket extending from the chassis, an extended function module extending from the extended management bracket, where the extended function module is located in an area in front of the one or more panels or line cards of the chassis; and a cable between the chassis and the extended function module. The cable supports data transmission between the chassis and the extended function module.

In this or other aspects, the extended management bracket can be mechanically fastened to the earring bracket, and the extended function module can be mechanically fastened to the extended management bracket. Further, the extended management bracket can extend perpendicularly from a front plane of the chassis, and the extended function module can extend from the extended management bracket parallel to the front plane of the chassis.

In this or other aspects, the extended function module can include one or more of a micro-processor, a storage unit, a display screen, and an I/O expander. Also, the cable can further provide a power supply from the chassis to the extended function module. In addition, the extended management bracket can include one or more guideways to secure wiring extending from a front of the one or more panel modules or line cards, and to allow the wiring extended from the front of the one or more panel modules or line cards to pass through the extended management bracket.

In another aspect, the optical communication equipment used in data center interconnection applications includes a chassis, including one or more panel modules or line cards, and an earring bracket for securing the chassis. Also included is an extended management bracket extending from the chassis, and an extended function module extending from the extended management bracket, where the extended function module being located in an area in front of the one or more panels or line cards of the chassis. Lastly, a printed circuit board assembly is included and mounted within the chassis, and extends outside the chassis, along the extended management bracket, from a proximal end to a distal end of the extended management bracket. The printed circuit board assembly is configured for connection to components of the extended function module, and supports data transmission between the chassis and the extended function module.

In this or other aspects, the extended management bracket can be hollow, of circular, rectangular, or square shape in cross-section, configured to house the printed circuit board assembly therein. The printed circuit board assembly could further provide a power supply from the chassis to components of the extended function module, and can be connected within a panel module of the chassis.

This or other aspects could further comprise an I/O expander located at a distal end of the extended management bracket, configured for connecting the printed circuit board assembly to components of the extended function module. In this arrangement, the I/O expander can provide communication interconnection protocols, at the extended function module, including SPI, IIC, U-art, or Ethernet. A port of the I/O expander can include one or more of RJ-45, standard USB, Micro-USB, Mini-USB, Type-C, D-sub.

In still another aspect, the optical communication equipment used in data center interconnection applications includes a chassis, including one or more panel modules or line cards, and including an earring bracket for securing the chassis. Also included is an extended management bracket secured to, and extending from, the chassis, and an extended function module secured to, and extending from, the extended management bracket. In this aspect, the extended function module is located in an area in front of the one or more panels or line cards of the chassis; the extended management bracket extends perpendicularly from a front plane of the chassis and the extended function module extends from the extended management bracket parallel to the front plane of the chassis; and the extended function module includes one or more of a micro-processor, a storage unit, a display screen, and an I/O expander. Lastly, a printed circuit board assembly is included and mounted within the chassis, and extends outside the chassis, within the extended management bracket, from a proximal end to a distal end of the extended management bracket. The printed circuit board assembly is configured for connection to components of the extended function module, and supports data transmission between the chassis and the extended function module. In this aspect, the extended management bracket is hollow, of circular, oval, rectangular, or square shape in cross-section, configured to house the printed circuit board assembly therein, and the I/O expander is located at a distal end of the extended management bracket, configured for connecting the printed circuit board assembly to components of the extended function module. The printed circuit board assembly could further provide a power supply from the chassis to the extended function module, and can be connected within a panel module of the chassis.

Advantages of the disclosed embodiments include: a) the extended function module can prevent chassis panel space limitations; b) the extended function module can communicate with the chassis through simple connection and standard protocols; c) the extended function module can be developed in parallel with the chassis; and d) the extended function module can fulfill various expanded or additional features based on specific application, and can allow new features to be added simply when required in future (or post original chassis design).

BRIEF DESCRIPTION OF THE ILLUSTRATED EMBODIMENTS

The present invention will be better understood with reference to the following description taken in combination with the drawings. For the purpose of illustration, there are shown in the drawings certain embodiments of the present invention. In the drawings, like numerals indicate like elements throughout. It should be understood, however, that the invention is not limited to the precise arrangements, dimensions, and instruments shown:

DETAILED DESCRIPTION OF THE ILLUSTRATED EMBODIMENTS

The disclosed subject matter relates to optical communication equipment used in data center interconnection (DCI) applications that typically include at least one or more chassis and service line cards. DCI applications connect two or more data centers using high speed packet-optical connectivity. DCI applications house computer and storage resources for applications, data and content. A line card is a printed circuit board that provides a transmitting/receiving port for a local area network (LAN), or a carrier's communication, or a wide area network (WAN). Line cards plug into company switches and high-end routers, which have a modular chassis that accepts a range of cards.

The optical communication equipment (e.g., multiple chassis, each with multiple line cards) is mounted into a data center cabinet, rack, or shelf. Attachment to the cabinet is often mechanical by earring bracket. An organizing bracket with guideway is often included on a left or right side of the chassis, in a vicinity of the earring bracket, for fiber and wiring management.

The disclosed subject matter also includes an extended function module that communicates with the chassis. The extended function module can include one or more of a micro-processor, a storage unit, a display screen, an input/output (I\O) expand, and power charging unit. If a micro-processer is included, the micro-processor is wired to other components and is powered by either an internal or external power supply.

Figure 1:
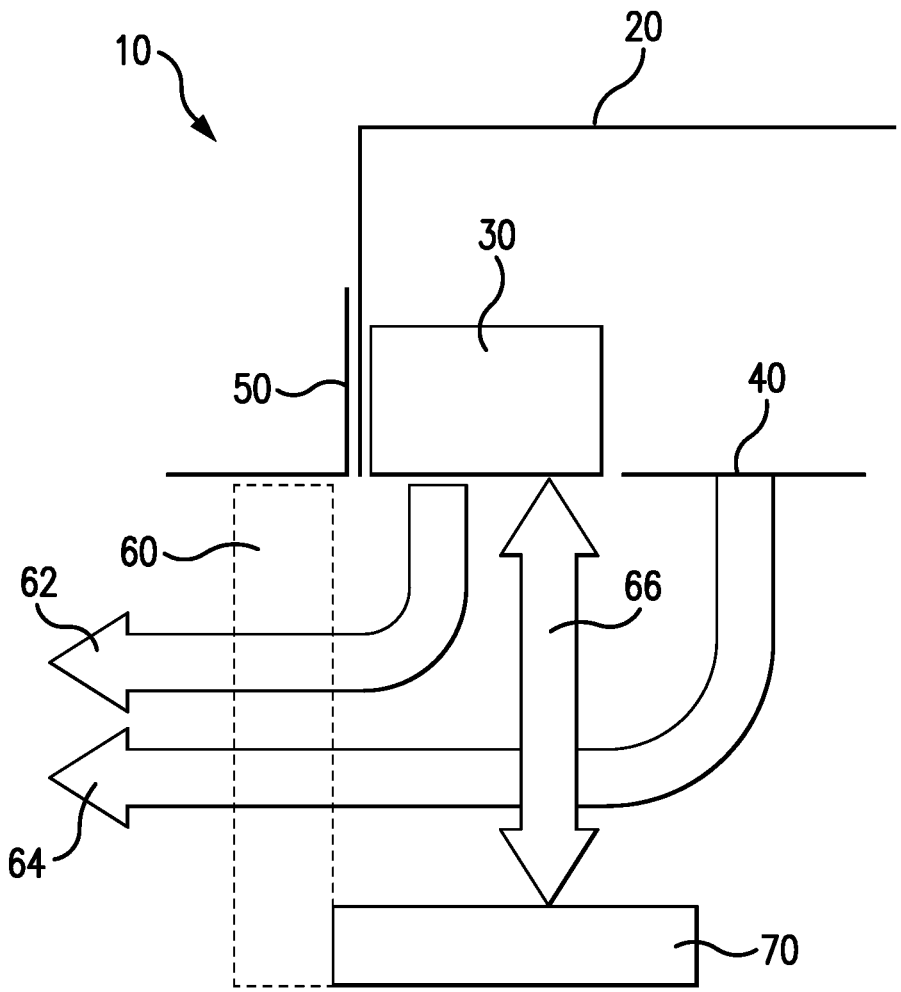
FIG. 1 illustrates a simplified block diagram of chassis equipment of data center interconnection (DCI) applications, according to one embodiment of the present disclosure.

FIG. 1 illustrates one embodiment of optical communication equipment 10 used in (DCI) applications, in accordance with the disclosed subject matter. FIG. 1 shows a chassis 20, within which one more panel modules 30 and/or service line cards 40 are housed. One or more chassis 20 are housed (stacked) within a cabinet or rack (not shown). Each chassis 20 is attached to the cabinet by an earring bracket 50. There is typically one earring bracket 50 on a left side (shown in FIG. 1) and one on a right side of each chassis 20. The earring bracket 50 provides for mechanical connection of each chassis 20 to the cabinet. The chassis 20 can include one or more motherboards, printed circuit board assemblies (PCBAs), function, control and power modules, cooling fans, and power supply and communication connection to panel modules and line cards.

FIG. 1 also illustrates an extended management bracket 60 extending from the earring bracket 50, where a proximal end of the extended management bracket 60 is connected to the earring bracket 50. The extended management bracket 60 could alternatively be connected to the cabinet or chassis 20, but is preferably connected to the earring bracket 50 to preserve front panel space in the chassis 20 for panel modules 30 and/or line cards 40. The extended management bracket 60 extends generally perpendicularly from a front panel plane of the chassis 20. One or more guideways can be provided in the extended management bracket 60 to secure panel module wiring 62 and line card wiring 64, and also to allow the wiring to pass through.

At a distal end of the bracket 60 is connected an extended function module 70. The extended function module 70 communicates with the chassis 20 via cable 66, supporting data transmission, power supply, etc., from the chassis 20 to the extended function module 70. The cable 66 can be a flexible, such as Flex-PCB. Preferably, the extended function module 70 is aligned parallel to the front panel plane of the chassis 20.

Figure 2:
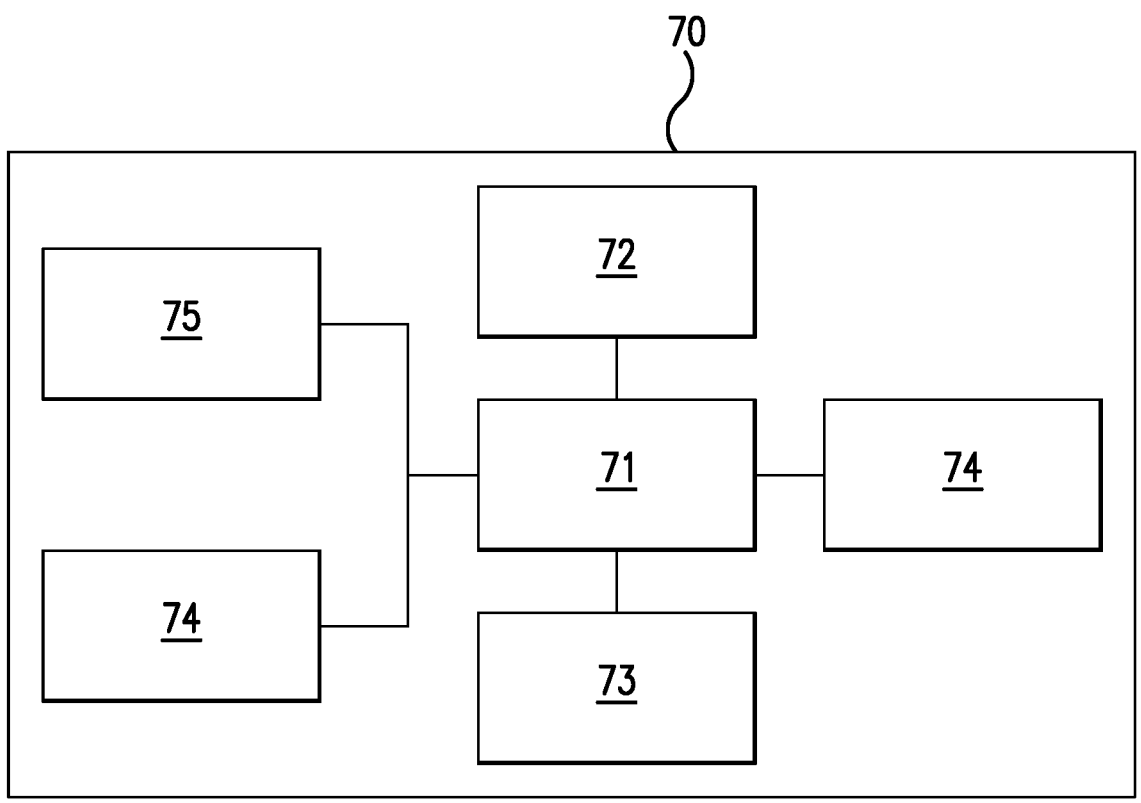
FIG. 2 illustrates a block diagram of components included in an exemplary embodiment of an extended function module of the present disclosure.

FIG. 2 illustrates a block diagram of the extended function module 70, and shows that the extended function module 70 can include any one or more of a micro-processor 71, a storage unit 72, a display screen 73, and an I/O expander 75. The extended function module 70 can be powered by an internal power unit 74 or an external supply provided from the chassis 20 through the cable 66.

The I/O expander 75 can be configured on the extended function module 70 to support standard communication protocol interconnection including, but not limited to, serial peripheral interface (SPI), inter-integrated circuit, eye-squared-C (I2C or IIC), universal asynchronous receiver/transmitter (U-art or UART), and Ethernet. In addition to a RJ-45 connector, a physical port of the I/O expander 75 can be standard universal seral bus (USB), Micro-USB, Mini-USB, Type-C USB connector, and/or D-sub connectors.

Figure 3:
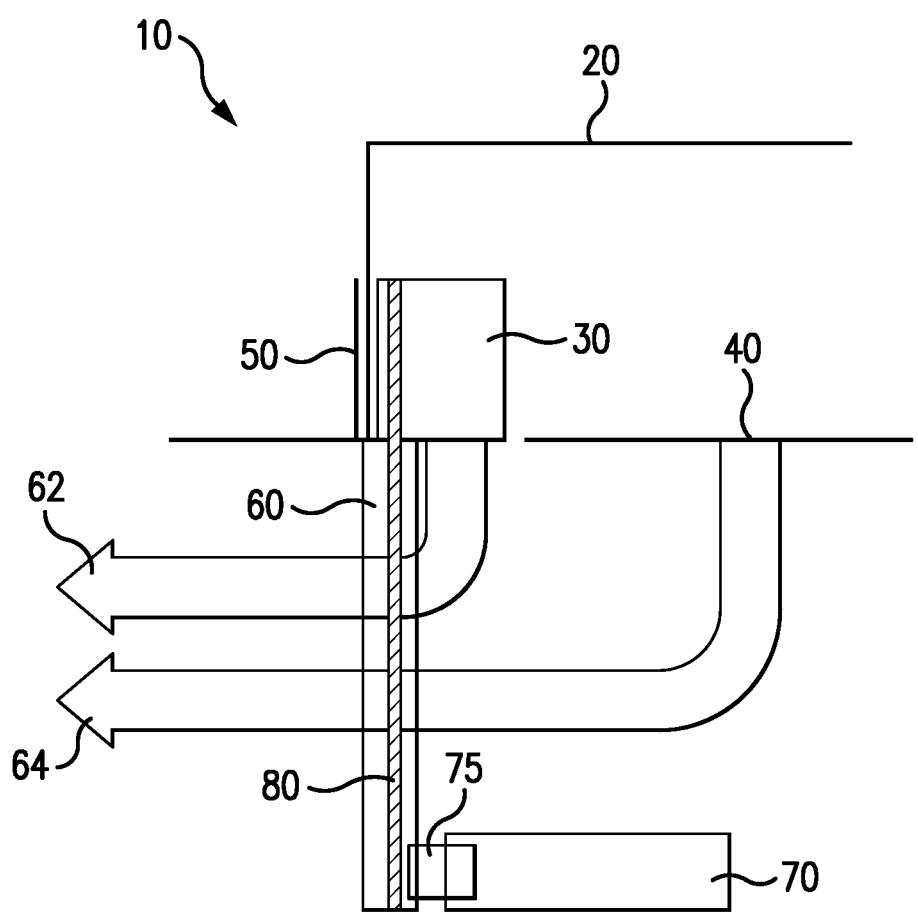
FIG. 3 illustrates a simplified block diagram of chassis equipment of DCI applications, according to another embodiment of the present disclosure.

FIG. 3 illustrates another embodiment of optical communication equipment 10 used in (DCI) applications, in accordance with the disclosed subject matter. This embodiment differs from that shown in FIG. 1 due, primarily, to the interconnection between the extended function module 70 and the chassis 20, and due to an integration of the extended management bracket 60 with the chassis 20. In this embodiment, the extended management bracket 60 will be aligned so that a printed circuit board assembly (PCBA) 80 can be mounted in an interior of the chassis 20, preferably aligned along a side of the chassis 20, from within a panel module 30. The PCBA 80 can extend outside the chassis 20, within and through the extended management bracket 60, to the extended function module 70.

To house the PCBA 80 within the extended management bracket 60, the extended management bracket 80 can be hollow, and of circular, oval, rectangular, or square shape in cross-section. Alternatively, the extended management bracket 60 can be planar, with PCBA 80 aligned thereto. In this embodiment, the I/O expander 75 is located on a distal end of (or the extended area of) the PCBA 80 to connect the PCBA 80 to components of the extended function module 70. Use of a PCBA 80, rather than the cable 66, to provide data transmission between the extended function module 70 and the chassis 20 can be beneficial, as data transmission speed can by much higher with a PCBA 80. In addition, the PCBA 80 has greater capability for supplying power to the extended function module 70 than an internal power unit 74 or an external supply by cable. Nonetheless, the extended function module 70 could alternatively be powered by an internal power unit 74 or an external supply.

Otherwise, the FIG. 3 embodiment is similar to the FIG. 1 embodiment, showing the chassis 20, within which one or more panel modules 30 and/or service line cards 40 are housed. One or more chassis 20 are housed (stacked) within a cabinet or rack (not shown). Each chassis 20 is attached to the cabinet by an earring bracket 50, where there is typically one earring bracket 50 on a left side (shown in FIG. 3) and one on a right side of each chassis 20. The earring bracket 50 provides for mechanical connection of each chassis 20 to the cabinet.

FIG. 3 also illustrates the extended management bracket 60 extending from a vicinity of the earring bracket 50, where a proximal end of the bracket 60 is connected to the earring bracket 50. The extended management bracket 60 could alternatively be connected to the cabinet or chassis 20, but is preferably connected to the earring bracket 50 to preserve front panel space in the chassis 20 for panel modules 30 and/or line cards 40. The extended management bracket 60 extends generally perpendicularly from a front panel plane of the chassis 20. One or more integrated guideways can be provided in the bracket 60 to secure panel module wiring 62 and line card wiring 64, and also to allow the wiring to pass through.

At a distal end of the extended management bracket 60 is connected the extended function module 70. Preferably, the extended function module 70 is aligned parallel to the front panel plane of the chassis 20. In either of the FIG. 1, or FIG. 3, embodiment, the chassis 20, and the earring bracket 50, and/or the extended management bracket 60, could be integrated into a single body.

Advantages of the disclosed embodiments include: a) the extended function module 70 can prevent chassis panel space limitations; b) the extended function module 70 can communicate with the chassis 20 through simple connection and standard protocols; c) the extended function module 70 can be developed in parallel with the chassis; and d) the extended function module 70 can fulfill various expanded or additional features based on specific application, and can allow new features to be added simply when required in future (or post original chassis design).

These and other advantages of the present invention will be apparent to those skilled in the art from the foregoing specification. Accordingly, it will be recognized by those skilled in the art that changes, or modifications may be made to the above-described embodiments without departing from the broad inventive concepts of the invention. For example, features detailed as included in certain specific embodiments above are recognized as interchangeable and possibly included in other detailed embodiments. It should therefore be understood that this invention is not limited to the particular embodiments described herein but is intended to include all changes and modifications that are within the scope and spirit of the invention.

What is claimed is:

1. Optical communication equipment used in data center interconnection applications, comprising:
    a chassis, including one or more panel modules or line cards;

an extended management bracket configured to extend from the chassis;

an extended function module configured to extend from the extended management bracket, the extended function module being located in an area in front of the one or more panels or line cards of the chassis; and a printed circuit board assembly having a proximal end within the chassis, the printed circuit board assembly extending outside the chassis, within or along the extended management bracket, configured for connection to components of the extended function module, the printed circuit board assembly supporting data transmission between the one or more panel modules or line cards of the chassis and components of the extended function module.

2. The optical communication equipment of claim 1, wherein the extended management bracket is mechanically fastened to an earring bracket securing the chassis, and the extended function module is mechanically fastened to the extended management bracket.

3. The optical communication equipment of claim 1, wherein the extended management bracket extends perpendicularly from a front plane of the chassis and the extended function module extends from the extended management bracket parallel to the front plane of the chassis.

4. The optical communication equipment of claim 1, wherein the extended function module includes one or more of a micro-processor, a storage unit, a display screen, and an I/O expander.

5. The optical communication equipment of claim 1, wherein the printed circuit board assembly cable further provides a power supply from the chassis to components of the extended function module.

6. The optical communication equipment of claim 1, wherein the extended management bracket includes one or more guideways to secure wiring extended from a front of the one or more panel modules or line cards, and to allow the wiring extended from the front of the one or more panel modules or line cards to pass through the extended management bracket.

7. Optical communication equipment used in data center interconnection applications, comprising:
    a chassis, including one or more panel modules or line cards;
    an extended management bracket extending from the chassis;
    an extended function module extending from the extended management bracket, the extended function module being located in an area in front of the one or more panels or line cards of the chassis; and
    a printed circuit board assembly mounted within the chassis, extending outside the chassis, along or within the extended management bracket, from a proximal end to a distal end of the extended management bracket, configured for connection to components of the extended function module, the printed circuit board assembly supporting data transmission between the chassis and components of the extended function module.

8. The optical communication equipment of claim 7, wherein the extended management bracket is mechanically fastened to an earring bracket securing the chassis, and the extended function module is mechanically fastened to the extended management bracket.

9. The optical communication equipment of claim 7, wherein the extended management bracket extends perpendicularly from a front plane of the chassis and the extended function module extends from the extended management bracket parallel to the front plane of the chassis.

10. The optical communication equipment of claim 7, wherein the extended function module includes one or more of a micro-processor, a storage unit, a display screen, and an I/O expander.

11. The optical communication equipment of claim 7, wherein the extended management bracket is hollow, of circular, rectangular, or square shape in cross-section, configured to house the printed circuit board assembly therein.

12. The optical communication equipment of claim 7, wherein the printed circuit board assembly further provides a power supply from the chassis to components of the extended function module.

13. The optical communication equipment of claim 12, further comprising an I/O expander located at a distal end of the extended management bracket, configured for connecting the printed circuit board assembly to components of the extended function module.

14. The optical communication equipment of claim 13, wherein the I/O expander, connecting the printed circuit board assembly to components of the extended function module provides communication interconnection protocols, at the extended function module, including SPI, IIC, U-art, or Ethernet.

15. The optical communication equipment of claim 14, wherein a port of the I/O expander includes one or more of RJ-45, standard USB, Micro-USB, Mini-USB, Type-C, D-sub.

16. The optical communication equipment of claim 7, wherein the extended management bracket includes one or more guideways to secure wiring extended from a front of the one or more panel modules or line cards, and to allow the wiring extended from the front of the one or more panel modules or line cards to pass through the extended management bracket.

17. Optical communication equipment used in data center interconnection applications, comprising:
    a chassis, including one or more panel modules or line cards, including an earring bracket for securing the chassis;
    an extended management bracket secured to, and extending from, the chassis;
    an extended function module secured to, and extending from, the extended management bracket, wherein:
        the extended function module is located in an area in front of the one or more panels or line cards of the chassis;
        the extended management bracket extends perpendicularly from a front plane of the chassis and the extended function module extends from the extended management bracket parallel to the front plane of the chassis;
        the extended function module includes one or more of a micro-processor, a storage unit, a display screen, and an I/O expander; and
    a printed circuit board assembly mounted within the chassis, extending outside the chassis, within the extended management bracket, from a proximal end to a distal end of the extended management bracket, configured for connection to components of the extended function module, the printed circuit board assembly supporting data transmission between the chassis and components of the extended function module; wherein:

the extended management bracket is hollow, of circular, oval, rectangular, or square shape in cross-section, configured to house the printed circuit board assembly therein;

the I/O expander is located at a distal end of the extended management bracket, configured for connecting the printed circuit board assembly to components of the extended function module.

18. The optical communication equipment of claim 17, wherein the extended management bracket is mechanically fastened to the earring bracket, and the extended function module is mechanically fastened to the extended management bracket.

19. The optical communication equipment of claim 17, wherein the printed circuit board assembly further provides a power supply from the chassis to components of the extended function module.

20. The optical communication equipment of claim 17, wherein the extended management bracket includes one or more guideways to secure wiring extended from a front of the one or more panel modules or line cards, and to allow the wiring extended from the front of the one or more panel modules or line cards to pass through the extended management bracket.

* * * * *